Dec. 22, 1970 D. R. CURRAN ET AL 3,549,414

METHOD OF TUNING PIEZOELECTRIC RESONATORS

Original Filed April 19, 1965

INVENTORS
DANIEL R. CURRAN
DONALD J. KONEVAL

BY Elmer J. Hyde [signature]

ATTORNEY

United States Patent Office 3,549,414

Patented Dec. 22, 1970

3,549,414

METHOD OF TUNING PIEZOELECTRIC RESONATORS

Daniel R. Curran, Cleveland Heights, and Donald J. Koneval, Lyndhurst, Ohio, assignors to Clevite Corporation, a corporation of Ohio Original application Apr. 19, 1965, Ser. No. 449,063, now Patent No. 3,401,276. Divided and this application June 12, 1968, Ser. No. 736,368

Int. Cl. H01v 7/00

U.S. Cl. 117—212 9 Claims

ABSTRACT OF THE DISCLOSURE

A wafer of piezoelectric material is provided with electrodes on opposite surfaces thereof. Tuning is accomplished by the application of a high Q dielectric nonconducting film over the surface of at least one electrode and the surrounding nonelectroded wafer material. The film thickness is increased until the desired resonant frequency of the electroded region is obtained. Reference is made to the claims for a legal definition of the invention.

This application is a division of our earlier application Ser. No. 449,063 filed on Apr. 19, 1965, now Pat. No. 3,401,276.

This invention relates to improved piezoelectric resonators useful in electronic filter circuits and, specifically, to an improved method of tuning such resonators.

The invention has utility in connection with piezoelectric resonators comprising a thin wafer of monocrystalline or ceramic material having a vibrational mode producing a particle displacement in the plane of the wafer which is antisymmetrical about the center plane of the wafer. Such vibrational modes include the thickness shear, thickness twist and torsional modes all of which can be obtained with piezoelectric monocrystalline materials and in piezoelectric ceramic materials.

The typical wafer type of resonator of thickness ($t$) is provided with electrodes of predetermined area on opposite planar surfaces thereof to enable the resonator to be excited electromechanically in its principal vibratory mode. At the resonant condition maximum particle motion and wave amplitude occur.

Recent innovations in the design and construction of piezoelectric resonators has resulted in the existence of additional criteria applicable to the design of resonators and multiresonator filter circuits. In application Ser. No. 216,846, filed Aug. 14, 1962, by Daniel R. Curran and Adolph Berohn and assigned to the same assignee as the present invention, now Pat. No. 3,222,622, there is disclosed a multiple resonator structure comprising a plurality of individual resonators on a single wafer. This structure is accomplished by spacing the resonator electrodes in accordance with the "range of action" or extent of wave propagation of the individual resonators in the surrounding wafer material. The invention disclosed and claimed in said application makes possible subminiature filter packages through utilization of only a single wafer for the plurality of individual resonators of a filter circuit.

In copending application Ser. No. 672,422 filed on Sept. 29, 1967, now Pat. No. 3,384,768, by William Shockley and Daniel R. Curran and also assigned to the same assignee as the present invention, said application being a continuation of application Ser. No. 592,947 filed on Nov. 8, 1966, now abandoned and which was a continuation of application Ser. No. 281,488 filed on May 20, 1963, and subsequently abandoned, there are disclosed resonator structures in which wave propagation beyond the electroded region is minimized to thereby reduce the "range of action" and maximize the mechanical Q. This is accomplished by structurally establishing a relationship between the resonant frequency $f_a$ of the electroded region and the resonant frequency $f_b$ of the surrounding nonelectroded region of the wafer whereby the frequency $f_b$ acts as a cutoff frequency for propagation of the vibratory mode from the electroded region. The relationship is preferably such that $f_a/f_b$ is in the range of 0.8 to 0.999, i.e., a value less than one, as disclosed in application Ser. No. 672,422, now Pat. No. 3,384,768. One disclosed method of accomplishing the frequency relationship is to utilize a calculated electrode thickness $t_e$ relative to the thickness $t_w$ of the wafer to effect a predetermined mass loading of the electroded region whereby its resonant frequency is decreased relative to that of the surrounding wafer material.

As disclosed in our copending application Ser. No. 448,922 filed Apr. 19, 1965, now Pat. No. 3,401,283, for a given wafer of thickness $t_w$ and an electrode diameter $d$ there is a very limited range in which the operating frequency can be varied or tuned by varying the mass loading of the electroded region without introducing spurious responses. More specifically, utilizing the mass loading concept disclosed in copending application Ser. No. 672,422, now Pat. No. 3,384,768, the electrode diameter ($d$) of a high frequency resonator structure may be expressed by the following equation as disclosed in copending application Ser. No. 448,922, now Pat. No. 3,401,283:

$$d \leq \frac{Mt_w}{n}\left(\frac{f_a}{f_b - f_a}\right)^{1/2} \quad (1)$$

where M is a constant, $t_w$ is the wafer thickness, $n$ is the order of harmonic (1, 3, 5, etc.), $f_a$ is the resonant frequency of the electroded region of the wafer, $f_b$ is the calculated cutoff resonant frequency of the surrounding nonelectroded region. In cases where Equation 1 is not satisfied, unwanted inharmonic overtone responses will result.

By means of Equation 1 the maximum separation between the resonant frequency of the electroded region and the resonant frequency of the nonelectroded region of the wafer which can be used without introducing spurious responses may be determined. Specifically, Equation 1 can be solved for $f_a/f_b$ to obtain the minimum frequency ratio.

In the fabrication of a resonator structure using the above criteria the electrode diameter is initially selected in accordance with the particular characteristics desired, e.g., capacitance, resistance, etc. The diameter determined and the operating frequency $f_a$ are then inserted into Equation 1 whereupon the equation is solved for $f_b$. The relative thicknesses of the electroded and nonelectroded regions are then determined accordingly to achieve the desired relationship between $f_a$ and $f_b$.

As is known to those skilled in the art the exact operating frequency cannot be practically achieved using calculated dimensions due to difficulties in maintaining close manufacturing tolerances, and subsequent tuning of the structure is necessary. In addition, in the case of a multiple resonator structure such as disclosed in copending application Ser. No. 216,846, now Pat. No. 3,222,622, different operating frequencies of individual resonators may be desired necessitating separate tuning of the individual resonators.

In the past, tuning has been accomplished by measuring the resonant frequency of the electroded region upon fabrication of the structure and then varying the electrode thickness by removing or adding electrode material until the exact operating frequency is obtained. The frequency shift which can be accomplished using this process without detrimentally affecting the resonator characteristics is substantially limited. If more than a predetermined amount of electrode material is added the mass loading of the electrode region will be changed to the extent that the ratio $f_a/f_b$ will be modified and spurious responses will result. This limitation creates particular difficulties in fabricating a multiresonator structure where it may be desired to establish a substantial frequency difference between individual resonators on a wafer of uniform thickness to achieve the desired relationship between resonant and antiresonant frequencies of resonators forming a filter circuit.

It is a principal object of the present invention to provide an improved resonator structure tuned to a desired resonant frequency without affecting the relationship between resonant frequencies of the electroded and surrounding regions.

Another object of the invention is to provide an improved method of tuning a piezoelectric resonator.

In accordance with the invention a wafer of piezoelectric material is provided with electrodes on opposite surfaces thereof which coact with the intervening piezoelectric materials to form a piezoelectric resonator. The relative thicknesses of the electrodes and electroded and nonelectroded regions of the wafer are dimensioned such that the resonant frequencies of the electroded and nonelectroded regions are related to provide a desired mass loading of the electroded region. The structure is fabricated such that the approximate operating frequency obtained is higher than the operating frequency desired. Tuning is accomplished by the uniform application of a high Q dielectric nonconducting film over the surface of at least one electrode and the surrounding nonelectroded wafer material. The film thickness is increased until the desired resonant frequency of the electroded region is obtained. The identical increase in thickness of both the electroded and surrounding nonelectroded regions decreases the resonant frequency of both regions simultaneously without changing the desired frequency relationship therebetween. Accordingly, the resonator characteristics are not effected by the tuning technique.

Other objects and advantages will become apparent with the following description taken in conjunction with the accompanying drawing wherein.

Figure 1:
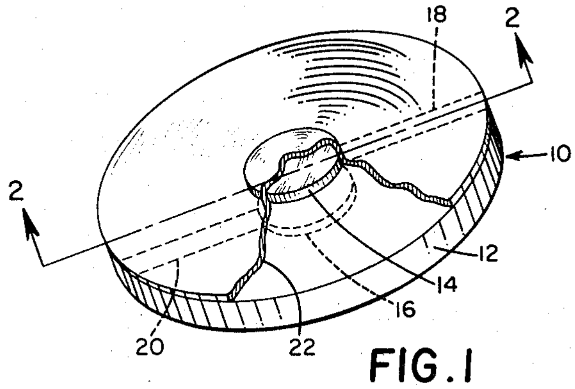
FIG. 1 is a perspective view of a piezoelectric resonator embodying the invention.

Referring to FIG. 1 of the drawing there is shown a schematic illustration of a piezoelectric resonator identified generally by the reference numeral 10. In general the resonator 10 comprises a thin wafer of piezoelectric material 12 having a pair of oppositely disposed electrodes 14 and 16 which coact with the intervening piezoelectric material. The wafer 12 is additionally provided with electrically conductive leads 18 and 20 on the opposite surfaces thereof which extend from their respective electrodes to the wafer edge to facilitate connection of resonator 10 in an electrical circuit. The electrodes 14 and 16 and leads 18 and 20 may be formed by vapor depositing a suitable electrically conductive material such as aluminum, gold or silver on the wafer surfaces using known masking techniques. Alternately, the electrodes and leads may be positioned within suitable recesses in the wafer face in the manner disclosed and claimed in our copending application Ser. No. 448,923 and now Pat. No. 3,363,119. The resonator 10 may additionally incorporate any of the structural modifications disclosed and claimed in application Ser. No. 672,422 now Pat. No. 3,384,768 for achieving a desired relationship between the resonant frequency of the electroded region and nonelectroded region. For the purposes of simplifying the present disclosure, however, the resonator 10 is depicted as comprising a circular wafer of uniform thickness having circular electrodes and leads on the face surfaces thereof, the electrodes being of the thickness necessary to achieve the desired mass loading of the electroded region in accordance with the theory disclosed in application Ser. No. 672,422, now Pat. No. 3,384,768, and application Ser. No. 448,922, now Pat. No. 3,401,283.

Preferably, the wafer 12 is formed from monocrystalline or ceramic material having a vibrational mode producing a particle displacement in the plane of the wafer which is antisymmetrical about the center plane of the wafer, e.g., thickness shear, thickness twist and torsional modes.

Known monocrystalline piezoelectric materials include quartz, Rochelle Salt, DKT (di-potassium tartrate), lithium sulfate or the like. As is well known to those skilled in the crystallographic arts, the basic vibrational mode of a crystal wafer is determined by the orientation of the wafer with respect to the crystallographic axis of the crystal from which it is cut. It is known for example that "0° Z-cut" of DKT or an "AT-cut" of quartz may be used for a thickness shear mode of vibration.

Of the various monocrystalline piezoelectrics available quartz, primarily because of its stability and high mechanical quality factor $Q_m$ is a preferred material for narrow band filter applications. An "AT-cut" quartz wafer responds in the thickness shear mode to a potential gradient between its major surfaces and is particularly suitable because of its frequency temperature stability.

For wider band filters the wafers are preferred fabricated of a suitable polarizable ferroelectric ceramic material such as barium titanate, lead zirconate-lead titanate, or various chemical modifications thereof. Suitable ceramic material for the purposes of the invention are ceramic compositions of the type disclosed and claimed in U.S. Pat. No. 3,006,857 and the copending application of Frank Kulcsar and William R. Cook, Jr., Ser. No. 164,076, filed Jan. 3, 1962 and assigned to the same assignee as the present invention and now Pat. No. 3,179,-594. Such ferro-electric ceramic compositions may be polarized by methods known to those skilled in the art. For example, a thickness shear mode of vibration may be accomplished through polarization in a direction parallel to the major surfaces of a wafer, in the manner described in U.S. Pat. 2,646,610 to A. L. W. Williams.

While, as discussed, the inventive concept is equally applicable to monocrystalline or ceramic piezoelectric wafers having a vibrational mode wherein the partial motion is antisymmetrical with respect to the center plane, the disclosure will be in regard to resonators comprising an "AT-cut" quartz crystal.

In accordance with the teaching of copending applications Ser. No. 672,422, now Pat. No. 3,384,768 and Ser. No. 448,922, now Pat. No. 3,401,283, the resonator 10 defines an electroded region which has a resonant frequency $f_a$ which is less than the resonant frequency $f_b$ of the surrounding wafer region. Preferably the frequencies $f_a$ and $f_b$ are related whereby $f_a/f_b$ is in the range of 0.8 to .99999.

In the fabrication of the resonator structure the electrode diameter is initially selected in accordance with the characteristics desired, e.g., capacitance resistance, etc. The diameter determined and a value of $f_a$ slightly higher than the actual desired operating frequency are then inserted into Equation 1 whereupon the equation is solved for $f_b$. The thicknesses of the wafer and electrodes are then determined in accordance with the theory disclosed in application Ser. No. 672,422, now Pat. No. 3,384,768. Specifically, the resonant frequency $f_a$ of the electroded region may be determined by the following equation:

$$f_a = \frac{N}{t_a}\left[1 + 2\frac{\rho_e}{\rho_q}\frac{t_e}{t_a}\right]^{-1} \qquad (2)$$

where $\rho_e$ is the density of the electrode material and $\rho_q$ is the density of quartz, $t_e$ is the electrode thickness, $t_a$ is the wafer thickness in the electroded region and N is the frequency constant.

The resonant frequency $f_b$ of the nonelectroded region may be expressed as follows in terms of the frequency constant N and wafer thickness $t_b$:

$$f_b = \frac{N}{t_b} \tag{3}$$

Combining Equations 2 and 3 the resonant frequency ratio $\Omega_0$ may be expressed as follows:

$$\Omega_0 = \frac{f_a}{f_b} = \frac{t_b}{t_a}\left[1 + 2\frac{\rho_e}{\rho_q}\frac{t_e}{t_a}\right] \tag{4}$$

It will be apparent that through application of Equations 2, 3 and 4 the electroded and nonelectroded regions may be selectively sized to produce a desired resonant frequency difference.

Referring now to the tuning feature embodying the present invention, upon fabrication of the basic resonator structure in the manner described a thin film or coating 22 of a high Q dielectric insulating material such as silicon monoxide is applied to the electrode 14 and the upper wafer surface such as by a vapor deposition technique. Alternately, a thin film of metal such as aluminum or tantalum may be uniformly applied to the wafer surface and then anodized to produce an insulating dielectric film. From the standpoint of simplicity the direct application of an insulating film such as silicon monoxide is preferred since only a single process step is required.

The resonant frequency of the electroded region is preferably measured by means of a conventional frequency measuring circuit during application of the insulating coating 22, and the coating process is terminated upon obtainment of the desired operating frequency. The coating process described results in a uniform film of constant thickness of the electrode 14 and adjacent wafer surfaces. The presence of the coating 22 on electrode 14 effectively mass loads the electroded region to tune the same to a desired operating frequency. The presence of the coating 22 on the nonelectroded region of the wafer proportionally decreases the resonant frequency of the nonelectroded region. Thus, the frequency relationship between the electroded and nonelectroded regions is not affected by the tuning process.

A substantial decrease in operating frequency is possible using the disclosed tuning technique. The only practical limitation on the coating thickness is that an excessive thickness establishes a large inactive mass which decreases the mechanical Q to some extent. In the case of one 59-megacycle resonator constructed and tested, the resonant frequency was decreased approximately 334 kilocycles by the application of a silicon monoxide coating having a thickness of approximately 9500 angstroms. The frequency response curves of the resonator before and after application of the coating were substantially identical and the change in mechan cal Q was insignificant.

The resonant frequency $f_a$ of the electroded region of the resonator 10 upon application of the coating 22 may be expressed by the following equation:

$$f_a = \frac{N}{t_a}\left[1 + 2\frac{\rho_c}{\rho_p}\frac{t_c}{t_a}\right]^{-1}\left[1 + 2\frac{\rho_e}{\rho_q}\frac{t_e}{t_a}\right]^{-1} \tag{5}$$

where the additional terms $\rho_c$ and $t_c$ are the coating density and thickness respectively, and terms of second order and higher of the form $\rho_c t_c \rho_e t_e/(\rho_q t_a)^2$ are considered to be negligible.

Similarly, the resonant frequency $f_b$ of the nonelectroded portion of the wafer 10 may be expressed by the following equation:

$$f_b = \frac{N}{t_b}\left[1 + 2\frac{\rho_c}{\rho_q}\frac{t_c}{t_b}\right]^{-1} \tag{6}$$

For a wafer of uniform thickness where $t_a$ and $t_b$ are equal, the resonant frequency ratio may be expressed as follows by combining Equations 5 and 6:

$$\Omega_0 = \left[1 + 2\frac{\rho_e}{\rho_q}\frac{t_e}{t_a}\right]^{-1} \tag{7}$$

It will be thus apparent that the insulating coatings 22 does not measurably affect the frequency ratio and the resonant characteristics.

Figure 2:
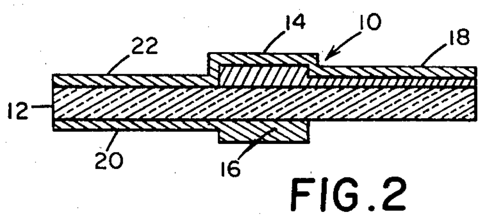
FIG. 2 is a section taken along line 2—2 of FIG. 1.

While the insulating coating 22 is shown in FIG. 2 as covering the entire surface of one side of the wafer 12 it will be appreciated by those skilled in the art that to be effective the coating 22 need only cover the electrode and the immediately adjacent area of the nonelectroded region in which vibratory motion occurs, i.e., the active regions of the resonator. In practice, however, it is easier to coat the entire surface of one side rather than mask and coat selective portions of the wafer. It also will be obvious to those skilled in the art that insulating tuning coatings could also be applied to both sides of the wafer.

Figure 3:
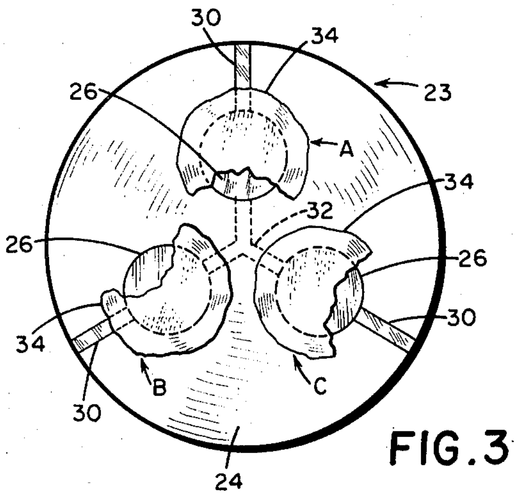
FIG. 3 is a top view of a multiresonator structure incorporating the invention.

In FIG. 3 there is shown a multiresonator structure indicated generally by the reference numeral 23 comprising a wafer 24 of uniform thickness having a plurality of electrodes 26 on one face surface thereof and a plurality of counter electrodes (not shown) on the opposite face surface thereof.

The electrode pairs coact with the intervening piezoelectric material to define a plurality of piezoelectric resonators A, B and C. In accordance with the concept disclosed in copending application Ser. No. 216,846, now Pat. No. 3,222,622, the individual resonators thus formed are spaced in accordance with their range of action in the surrounding wafer material to provide simultaneous independent operation of the individual resonators.

Figure 4:
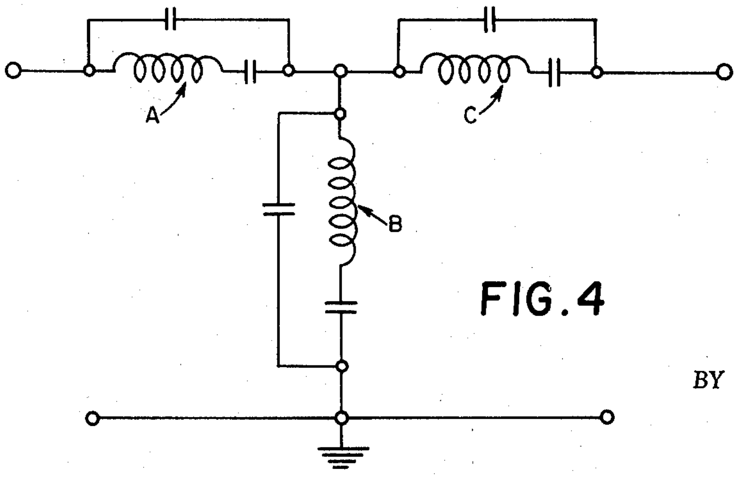
FIG. 4 is a schematic illustration of the equivalent circuit of the multiresonator structure shown in FIG. 3.

To facilitate electrical connection of the individual resonators in a filter configuration in an electrical circuit the wafer 24 is provided with electrically conductive leads 30 and 32 on opposite face surfaces thereof. With the particular electrical connection shown the filter circuit thus formed comprises a T-section filter having the equivalent circuit illustrated in FIG. 4 of the drawings. As disclosed in application Ser. No. 216,846, now Pat. No. 3,222,622, any number of electrode pairs may be variously arranged and interconnected to provide different filter configurations. With the particular T-section filter depicted in FIG. 4 the series resonators A and C are preferably tuned to the same fundamental resonant frequency (contained in the passband) whereas the resonator B forming the shunt arm of the circuit is preferably tuned to be antiresonant at the center frequency of the passband.

In accordance with the present invention tuning of resonators A, B and C is accomplished by application of insulating coatings 34 to the electroded and nonelectroded regions of the resonators A, B and C. The coatings applied to resonators A and C will have the same approximate thickness since these resonators have the same operating frequency. However, to accomplish the desired tuning of resonator B a thicker coating 34 is applied.

It will be apparent that by use of the tuning feature in accordance with the present invention the individual electrodes of the wafer 24 may be fabricated to the same initial thickness whereupon the desired operating frequency may be achieved using films of different thicknesses. The invention accordingly has particular utility in connection with a multiresonator structure.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

It is claimed and desired to secure by Letters Patent of the United States:

1. The method of tuning a piezoelectric resonator having an electrode on at least one surface thereof which includes the step of: applying an insulating coating to said electrodes and at least the surrounding portion of said surface to mass load the same.

2. The method of tuning a piezoelectric resonator having a wafer of piezoelectric material and electrodes on opposite surfaces thereof which includes the step of: applying an insulating coating of a high Q dielectric material to at least one electrode and the adjacent wafer surface.

3. The method of tuning a piezoelectric resonator as claimed in claim 2 wherein said coating is applied by vapor deposition.

4. The method of tuning a piezoelectric resonator having a wafer of quartz material provided with electrodes on opposite surfaces thereof which includes the step of: applying a coating of silicon monoxide to at least one electrode and the surrounding portion of the wafer surface to mass load the same.

5. The method of tuning a piezoelectric resonator having a wafer of piezoelectric ceramic material provided with electrodes on opposite surfaces thereof which includes the step of applying a coating of silicon monoxide to at least one electrode and the surrounding wafer surface to mass load the same.

6. The method of tuning a piezoelectric resonator having a plurality of electroded regions defining a plurality of independently operative resonators which includes the steps of: selectively coating the electroded regions and the surrounding wafer material to establish desired operating frequencies thereof.

7. The method of fabricating an electric filter which includes the steps of: electroding selected areas of a wafer of piezoelectric material to establish a plurality of independently operative piezoelectric resonators; and selectively applying coatings of insulating material to said electroded areas and the adjacent wafer material to establish desired operating frequencies of said resonators.

8. The method of fabricating a piezoelectric resonator which includes the steps of: electroding a surface area of a wafer of piezoelectric material; vapor depositing a coating of insulating material on the electroded region and the adjacent wafer material to mass load the same to establish a desired operating frequency.

9. The method of fabricating a piezoelectric resonator which includes the steps of: electroding a surface of a wafer of piezoelectric material; vapor depositing a coating of aluminum on the electroded surface and the surrounding wafer material; and anodizing the aluminum coating.

References Cited

German Auslegeschrift 1,027,735, April 1958, pp. 117–106.

WILLIAM L. JARVIS, Primary Examiner

U.S. Cl. X.R.

117—106, 215, 217, 229; 148—6.3; 204—38; 333—72